United States Patent
Shea

(10) Patent No.: US 7,935,633 B2
(45) Date of Patent: May 3, 2011

(54) POLY ETCH WITHOUT SEPARATE OXIDE DECAP

(75) Inventor: Kevin Shea, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/726,506

(22) Filed: Mar. 22, 2007

(65) Prior Publication Data

US 2007/0163997 A1    Jul. 19, 2007

Related U.S. Application Data

(62) Division of application No. 11/168,023, filed on Jun. 28, 2005.

(51) Int. Cl.
*H01L 21/302* (2006.01)
(52) U.S. Cl. ........ 438/689; 438/692; 438/706; 257/314; 257/315; 257/316; 257/318; 216/37; 216/67
(58) Field of Classification Search .................. 438/689, 438/692, 706; 257/314, 315, 316, 318; 216/37, 216/67
See application file for complete search history.

(56) References Cited

U.S. PATENT DOCUMENTS

| | | |
|---|---|---|
| 4,871,422 A | 10/1989 | Scardera et al. |
| 4,921,572 A | 5/1990 | Roche |
| 4,992,134 A | 2/1991 | Gupta et al. |
| 5,039,349 A | 8/1991 | Schoeppel |
| 5,672,525 A | 9/1997 | Pan |
| 5,783,495 A | 7/1998 | Li et al. |
| 5,830,802 A | 11/1998 | Tseng et al. |
| 5,855,811 A | 1/1999 | Grieger et al. |
| 5,908,509 A | 6/1999 | Olesen et al. |
| 5,963,814 A | 10/1999 | Walker et al. |
| 5,990,019 A | 11/1999 | Torek et al. |
| 6,012,469 A | 1/2000 | Li et al. |
| 6,048,803 A | 4/2000 | Gardner et al. |

(Continued)

FOREIGN PATENT DOCUMENTS

JP    52-21457    6/1977

OTHER PUBLICATIONS

S. Wolf, Silicon Processing for the VLSI Era vol. 1 Lattice press (1986), pp. 514-519.*

(Continued)

*Primary Examiner* — Nadine G Norton
*Assistant Examiner* — Maki A Angadi
(74) *Attorney, Agent, or Firm* — Schwegman, Lundberg & Woessner, P.A.

(57) ABSTRACT

The use of an ammonium hydroxide spike to a hot tetra methyl ammonium hydroxide (TMAH) solution to form an insitu poly oxide decapping step in a polysilicon (poly) etch process, results in a single step rapid poly etch process having uniform etch initiation and a high etch selectivity, that may be used in manufacturing a variety of electronic devices such as integrated circuits (ICs) and micro electro-mechanical (MEM) devices. The etching solution is formed by adding 35% ammonium hydroxide solution to a hot 12.5% TMAH solution at about 70° C. at a rate of 1% by volume, every hour. Such an etch solution and method provides a simple, inexpensive, single step self initiating poly etch that has etch stop ratios of over 200 to 1 over underlying insulator layers and TiN layers.

26 Claims, 4 Drawing Sheets

U.S. PATENT DOCUMENTS

| | | |
|---|---|---|
| 6,114,241 A | 9/2000 | Choi et al. |
| 6,140,163 A | 10/2000 | Gardner et al. |
| 6,153,509 A | 11/2000 | Watanabe et al. |
| 6,225,232 B1 | 5/2001 | Lee |
| 6,235,145 B1 | 5/2001 | Li et al. |
| 6,238,592 B1 | 5/2001 | Hardy et al. |
| 6,245,605 B1 | 6/2001 | Hwang et al. |
| 6,277,722 B1 | 8/2001 | Lee et al. |
| 6,277,738 B1 | 8/2001 | Choi et al. |
| 6,288,419 B1 | 9/2001 | Prall et al. |
| 6,297,137 B1 | 10/2001 | Jung |
| 6,313,003 B1 | 11/2001 | Chen |
| 6,335,254 B1 | 1/2002 | Trivedi |
| 6,358,788 B1 * | 3/2002 | Chen et al. .................. 438/238 |
| 6,417,551 B2 | 7/2002 | Miyano |
| 6,429,105 B1 | 8/2002 | Kunikiyo |
| 6,491,763 B2 | 12/2002 | Verhaverbeke et al. |
| 6,517,738 B1 | 2/2003 | Torek et al. |
| 6,541,362 B2 | 4/2003 | Forbes et al. |
| 6,551,913 B1 | 4/2003 | Kim et al. |
| 6,589,884 B1 | 7/2003 | Torek |
| 6,593,229 B1 | 7/2003 | Yamamoto et al. |
| 6,703,317 B1 | 3/2004 | Cheng et al. |
| 6,720,132 B2 | 4/2004 | Tsai et al. |
| 6,740,595 B2 * | 5/2004 | Kudelka et al. ............. 438/704 |
| 6,743,722 B2 * | 6/2004 | Kassir ......................... 438/690 |
| 6,759,263 B2 | 7/2004 | Ying et al. |
| 6,770,568 B2 | 8/2004 | Brask |
| 6,774,012 B1 | 8/2004 | Narayanan |
| 6,835,672 B1 | 12/2004 | Park et al. |
| 6,840,250 B2 | 1/2005 | Kashkoush et al. |
| 7,009,264 B1 | 3/2006 | Schuegraf et al. |
| 7,029,999 B2 | 4/2006 | Lim et al. |
| 7,109,104 B2 | 9/2006 | Ku et al. |
| 7,126,199 B2 | 10/2006 | Dcozy et al. |
| 7,358,171 B2 | 4/2008 | Gonzalez et al. |
| 7,422,936 B2 | 9/2008 | Barns et al. |
| 7,442,319 B2 | 10/2008 | Shea |
| 7,544,622 B2 | 6/2009 | Bedge |
| 7,678,678 B2 | 3/2010 | Gonzalez et al. |
| 2001/0004790 A1 | 6/2001 | Gnade et al. |
| 2001/0014522 A1 | 8/2001 | Weimer et al. |
| 2001/0051440 A1 | 12/2001 | Torek et al. |
| 2002/0004263 A1 | 1/2002 | Tanabe et al. |
| 2002/0144709 A1 | 10/2002 | Kashkoush et al. |
| 2002/0173150 A1 | 11/2002 | Kawai et al. |
| 2003/0008513 A1 | 1/2003 | Howard |
| 2003/0040183 A1 | 2/2003 | Kujirai et al. |
| 2003/0045113 A1 | 3/2003 | Enomoto et al. |
| 2003/0121537 A1 | 7/2003 | Dunn |
| 2003/0175523 A1 | 9/2003 | Moya et al. |
| 2003/0181055 A1 | 9/2003 | Wu et al. |
| 2003/0219912 A1 | 11/2003 | Chen et al. |
| 2003/0222241 A1 | 12/2003 | Torek et al. |
| 2004/0051153 A1 | 3/2004 | Yamamoto et al. |
| 2004/0063276 A1 | 4/2004 | Yamamoto et al. |
| 2004/0101784 A1 | 5/2004 | Howard |
| 2004/0132272 A1 | 7/2004 | Ku et al. |
| 2004/0171241 A1 | 9/2004 | Kitamura et al. |
| 2004/0259339 A1 | 12/2004 | Tanabe et al. |
| 2004/0266154 A1 | 12/2004 | Lim et al. |
| 2005/0019992 A1 | 1/2005 | Hong et al. |
| 2005/0032335 A1 | 2/2005 | Gonzalez et al. |
| 2005/0085074 A1 | 4/2005 | Powell |
| 2005/0104114 A1 * | 5/2005 | Chen et al. .................. 257/314 |
| 2005/0136579 A1 | 6/2005 | Hao et al. |
| 2005/0191584 A1 | 9/2005 | Shea et al. |
| 2005/0250339 A1 | 11/2005 | Shea et al. |
| 2006/0046523 A1 | 3/2006 | Kavalieros et al. |
| 2006/0261415 A1 | 11/2006 | Gonzalez et al. |
| 2006/0261500 A1 | 11/2006 | Gonzalez et al. |
| 2006/0263729 A1 | 11/2006 | Shea et al. |
| 2006/0263730 A1 | 11/2006 | Shea et al. |
| 2006/0289389 A1 | 12/2006 | Shea |
| 2007/0070803 A1 | 3/2007 | Urquhart |
| 2007/0178705 A1 | 8/2007 | Shea |

OTHER PUBLICATIONS

U.S. Appl. No. 10/788,889 Response filed Nov. 19, 2007 to Non-Final Office Action mailed Aug. 17, 2007,14 pages.
U.S. Appl. No. 10/788,889 Advisory Action mailed Jul. 10, 2007, 3 pgs.
U.S. Appl. No. 10/788,889 Final Office Action mailed May 2, 2007, 14 pgs.
U.S. Appl. No. 10/788,889 Non Final Office Action mailed Aug. 17, 2007, 12 pgs.
U.S. Appl. No. 10/788,889 Non Final Office Action mailed Dec. 29, 2006, 15 pgs.
U.S. Appl. No. 10/788,889 Response filed Mar. 7, 2007 to Non Final Office Action mailed Dec. 29, 2006, 23 pgs.
U.S. Appl. No. 10/788,889 Response filed Jun. 28, 2007 to Final Office Action mailed May 5, 2007, 15 pgs.
U.S. Appl. No. 11/168,023 Final Office Action mailed Nov. 14, 2007, 12 pages.
U.S. Appl. No. 11/168,023 Advisory Action mailed Mar. 30, 2007, 3 pgs.
U.S. Appl. No. 11/168,023 Final Office Action mailed Jan. 25, 2007, 14 pgs.
U.S. Appl. No. 11/168,023 Non Final Office Action mailed Jun. 18, 2007, 14 pgs.
U.S. Appl. No. 11/168,023 Non Final Office action mailed Sep. 14, 2006, 15 pgs.
U.S. Appl. No. 11/168,023 Response filed Mar. 5, 2007 to Final Office Action mailed Jan. 25, 2007, 13 pgs.
U.S. Appl. No. 11/168,023 Response filed Apr. 25, 2007 to Advisory Action mailed Mar. 30, 2007, 14 pgs.
U.S. Appl. No. 11/168,023 Response filed Sep. 18, 2007 to Non Final Office Action mailed Jun. 18, 2007, 14 pgs.
U.S. Appl. No. 11/168,023 Response filed Dec. 14, 2006 to Non Final Office Action mailed Sep. 14, 2006, 11 pgs.
U.S. Appl. No. 11/494,056 Final Office Action Mailed Aug. 17, 2007, 20 pgs.
U.S. Appl. No. 11/494,056 Non Final Office Action mailed May 16, 2007, 17 pgs.
U.S. Appl. No. 11/494,056 Non Final Office Action mailed Oct. 31, 2007, 13 pgs.
U.S. Appl. No. 11/494,056 Response filed Jul. 12, 2007 to Non Final Office Action mailed May 16, 2007, 22 pgs.
U.S. Appl. No. 11/494,056 Response filed Oct. 10, 2007 to Final Office Action mailed Aug. 17, 2007, 16 pgs.
U.S. Appl. No. 11/494,666 Restriction Requirement mailed Sep. 17, 2007, 7.
U.S. Appl. No. 11/494,666 Non Final Office Action mailed Oct. 24, 2007, 9 pgs.
Wolf, S. , *Silicon Processing for the VLSI Era*, (1), Process Technology,(1986),514-517 and 551-552.

* cited by examiner

POLY ETCH WITHOUT SEPARATE OXIDE DECAP

CROSS REFERENCE TO RELATED APPLICATION(S)

This application is a Divisional of U.S. application Ser. No. 11/168,023, filed Jun. 28, 2005, which is incorporated herein by reference.

TECHNICAL FIELD

This application relates generally to semiconductor devices and device fabrication and, more particularly, to etching polysilicon layers without a separate oxide decapping procedure.

BACKGROUND

The semiconductor device industry has a market driven need to reduce the size of devices such as transistors, capacitors and electrically conductive interconnects in order to produce smaller integrated circuit devices (ICs). Smaller ICs result in improved operational speed and clock rate, and reduced power requirements in both the standby and operational modes. Smaller ICs need thinner dielectric layers, thinner diffusion layers and more closely spaced conductive interconnect layers, such as doped polycrystalline silicon (poly). Producing these closely spaced (finer pitch) poly lines requires improved poly etching techniques. Micro electromechanical (MEM) devices may use etched poly patterns as a portion of the device. Reducing the size of MEM devices increases their utility and decreases their price and power consumption in many cases.

It is known to improve poly pitch by use of plasma etch techniques to increase the slope of the etched poly sidewall to approaching 90 degrees, and to reduce the amount of sideways etching that occurs under the edge of the photo resist mask. However, plasma etch processes are slow, require substantial expensive equipment, and may have problems with what may be known as etch selectivity ratios. The etch selectivity ratio is the rate of etching of a first material divided by the rate of etch of a second material. A high etch selectivity of a material layer being etched over the underlying layer is important in IC and MEM manufacture, since it allows increased margin for timed etches by providing what may be called an etch stop. The increasingly small and reliable integrated circuits (ICs) devices will likely be used in products such as processor chips, mobile telephones, and memory devices such as dynamic random access memories (DRAMs).

Thus there exists a need in the art for a simple, inexpensive and uniform poly etch method that has both a high poly etch rate (to decrease manufacturing cost), and high etch selectivity of poly over the underlying single crystal silicon, doped oxide, or other material layers. It is known to etch poly layers using wet chemical etch tanks. Wet etching is simple and inexpensive, but there is an issue with the etch uniformity, both in terms of across the single wafer variations, and in lot to lot variations over time. One reason for this lack of uniformity in poly etching relates to the fact that if a poly layer is exposed to the oxygen in the air, which may be hard to avoid, the surface atoms of the poly oxidize to form what may be called a native oxide. Such a native oxide may be from 10 to 20 Angstroms (Å) in thickness, and the oxide may grow in a few hours. Wet chemical etches that have high poly etch rates and high etch selectivity over underlying oxides may be non uniform since the etching of the poly can not begin until the native oxide, which may be call a cap oxide, is etched (or decapped). Since the thickness of the oxide cap is a variable that depends at least in part on how long the poly layer has been exposed, and the storage conditions, then the amount of time it takes to decap the poly layer before etching begins may result in non-uniform etching.

It is known to place the wafers having the poly layer to be etched in a decapping solution, such as a hydrofluoric acid (HF) bath, prior to placing the wafers in a poly etch bath. However, the wafers must be washed in deionized water (DI water) and dried prior to going into the poly etch bath, and such a washing procedure may cause sufficient native oxide to regrow to again inhibit the initiation of the poly etch. Further, the variations in the amount of time that pass between the end of the decap process and the beginning of the poly etch may again result in lot to lot variations in the amount of poly etched. Yet further, the need to have two different wet chemical baths and the increase in production time and cost make this solution less than optimal. There may also be an operator safety issue in having an acid bath in the same general vicinity as the typically caustic poly etch bath, since acids and bases should not be mixed without safety precautions.

DETAILED DESCRIPTION

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure or a micro electro-mechanical (MEM) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1:
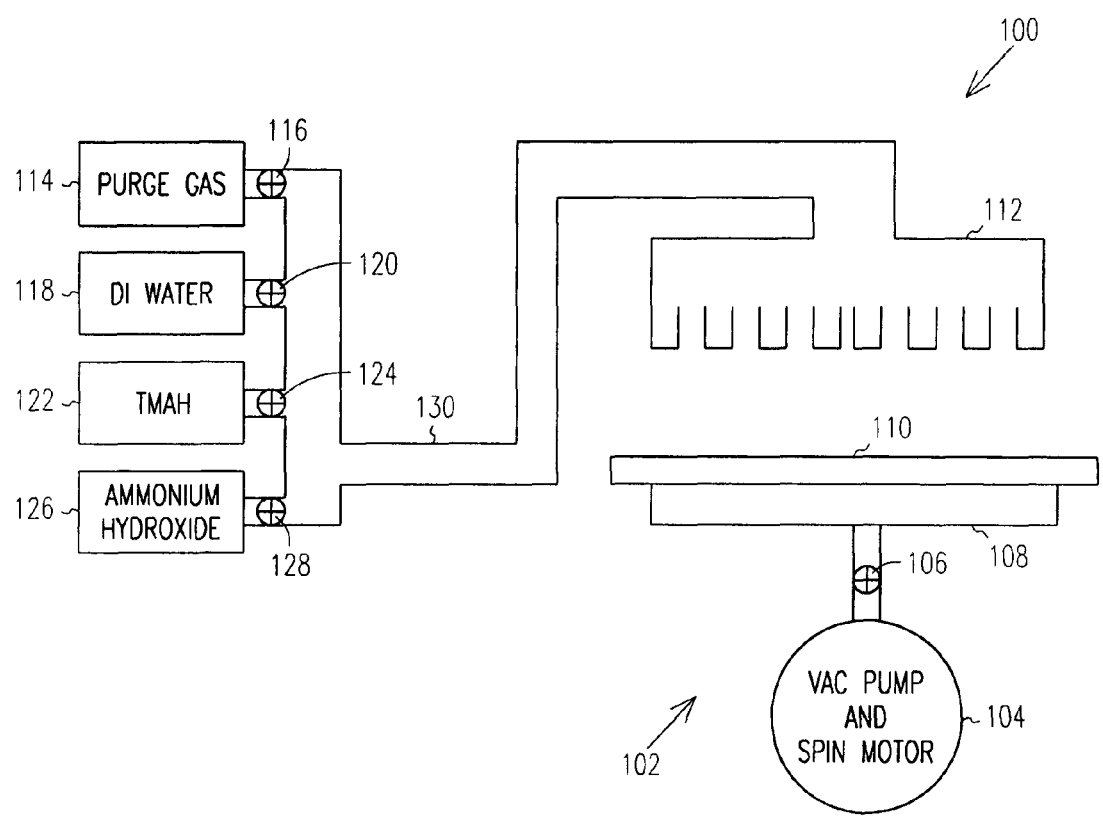
FIG. 1 illustrates an embodiment of an etch system.

FIG. 1 shows an embodiment of an illustrative spin spray etch polysilicon (poly) etch. A spin spray system 100 has a vacuum spin assembly 102 having a vacuum pump and spin motor assembly 104, connected via a valve and shaft 106 to a vacuum substrate holder (chuck) 108, using the vacuum pressure to hold substrate 110, which may illustratively be silicon. The substrate 110 is placed on the chuck 108, and the vacuum valve 106 opens to provide vacuum pressure from the vacuum pump 104 to hold the substrate 110 on the spin chuck 108.

The wafer 110 either remains stationary, or spins at a predetermined speed or program of spin speeds, while an etch mixture is dispensed from dispense fixture 112, illustratively shown as a shower head drip system. The subject matter is not so limited, and the fixture 112 may be a simple open tube nozzle, a high pressure atomizer (using purge gas 114 to break the etchant into tiny droplets), a linear array of drip nozzles, or other liquid dispense methods. The dispense fixture 112 receives materials such as a purge gas 114 through control valve 116, or deionized water (DI water) 118 through valve 120, or tetra methyl ammonium hydroxide (TMAH) 122 through valve 124, or ammonium hydroxide 126 through valve 128, or mixtures thereof, via pipe 130.

The etchants may be stored and dispensed in their final solution concentrations, or they may be mixed in pipe 130. As an illustrative example, the TMAH 122 may be in the form of 100% TMAH and the valve 124 may be opened sufficiently to provide a 10% mixture of TMAH mixed with 90% DI water 118 through valve 120. Alternatively, the TMAH 122 may be stored in the form of a 10% solution and dispensed through valve 124 directly through pipe 130 and dispense fixture 112 onto the substrate 110 without any mixing with any of the other stored materials 114, 118 or 126.

In an embodiment, the TMAH is provided as a 12.5% solution in DI water, and is mixed with 35% ammonium hydroxide during an initial decap etch stage prior to the main poly etch cycle. The TMAH storage 122 has a thermocouple and heater element to maintain a TMAH temperature of 90° C. The substrate 110 may be spun slowly during the initial oxide decap etch, or it may be held stationary in a puddle etch.

Figure 2:
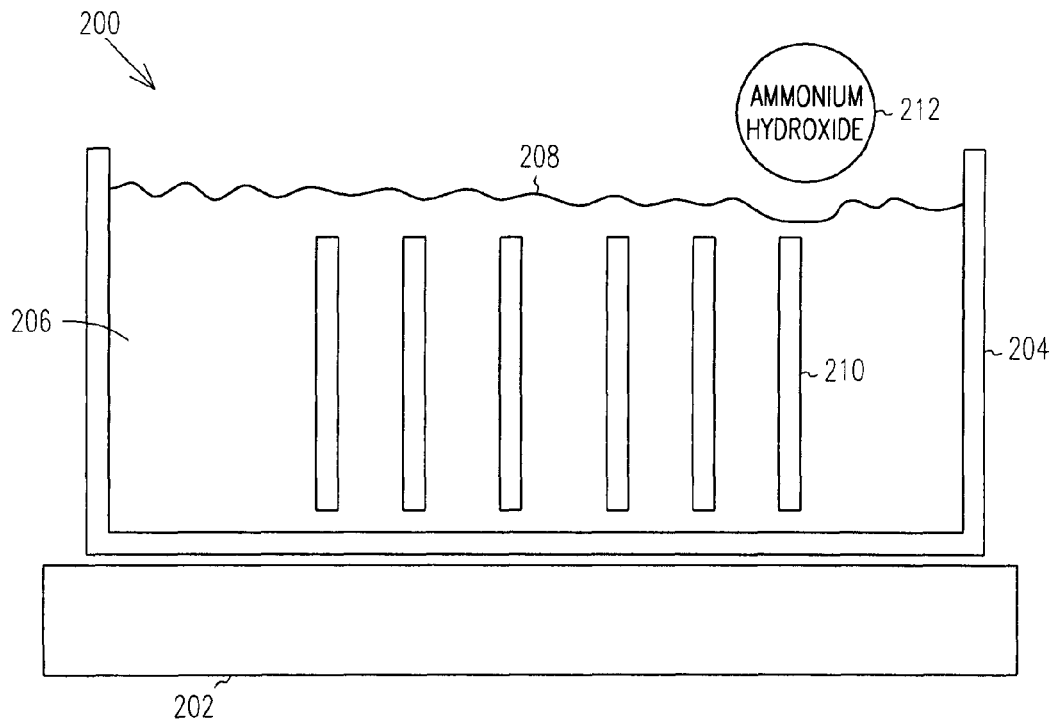
FIG. 2 illustrates an embodiment of a tank etch system.

FIG. 2 illustrates an embodiment of an illustrative tank poly etch system 200. A hot plate 202 containing a thermocouple or other temperature controlling device maintains the tank 204 and the etch solution 206 in the tank at a predetermined temperature, in an embodiment 90° C. The etch solution has a surface 208 with etch substrates 210 immersed below the level of the surface 208. Prior to immersing the substrates 210, or simultaneous to immersing the substrates, or after a predetermined time period has elapsed since the last time an ammonium hydroxide spike was added to the solution 206, in an embodiment one hour, a fixed volume of ammonium hydroxide 212 is added to the etch solution 206, in an embodiment 1% of the volume of the etch solution 206. In an embodiment, the pH of the solution 206 is maintained above a value of 13. The level of the etch solution 206 should always be high enough to cover all of the substrates 210.

Figure 3A:
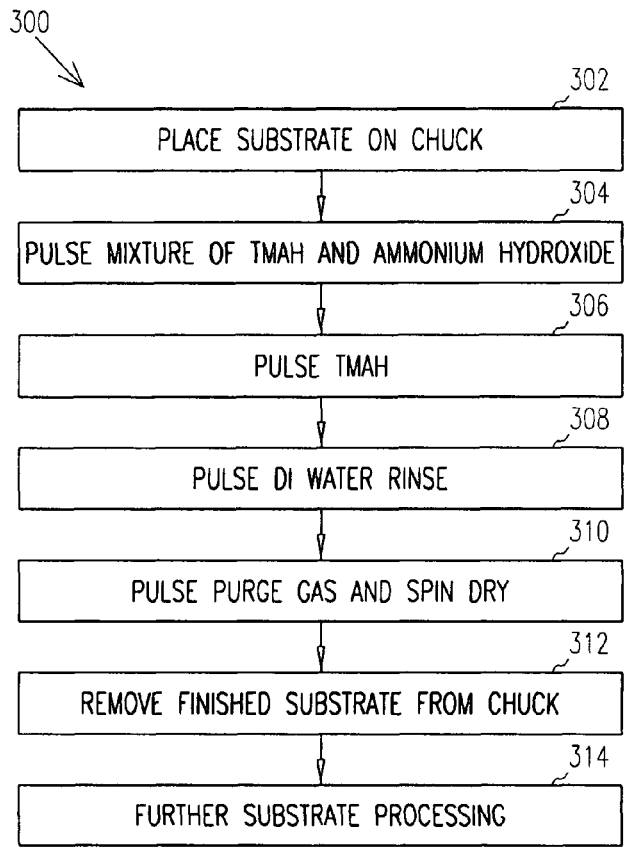
FIG. 3A illustrates a possible flow diagram for an embodiments of the etch method of FIG. 1.

FIG. 3A illustrates a flow chart of steps for a spin etch 300 using the apparatus shown in FIG. 1. At 302 a substrate is placed on the vacuum chuck, and then an oxide decap etch using a mixture of ammonium hydroxide and TMAH at a temperature of 90° C. occurs at 304, while the substrate remains stationary. After a fixed time period the ammonium hydroxide solution is turned off and the TMAH solution continues to flow, while the substrate slowly spins to agitate the etch solution and replace depleted portions of the etch solution at 306. This continues for a predetermined time period, when the TMAH solution is turned off and the DI water rinse solution is turned on at 308. The substrate continues to spin while the DI water rinse is progressing, until a predetermined time period expires, and the DI water is turned off. At 310 the substrate spins at a higher speed to dry the substrate, and the purge gas (typically nitrogen) may be turned on to blow dry the substrate. At 312 the substrate is removed from the chuck, typically by automated handling equipment, and moved to further substrate processing 314, such as photoresist removal, or dielectric deposition, or various memory or MEM fabrication steps.

Figure 3B:
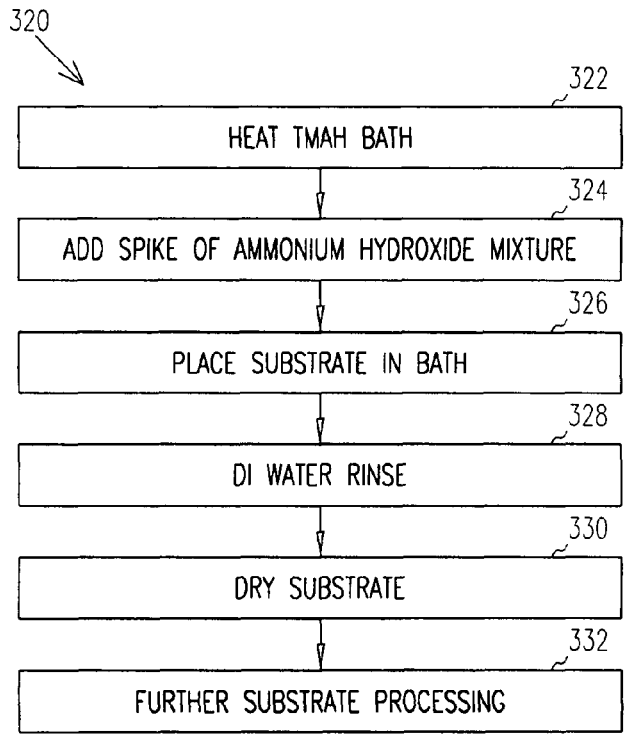
FIG. 3B illustrates a possible flow diagram for an embodiments of the etch method of FIG. 2.

FIG. 3B illustrates a flow chart for a tank etch 320 using the apparatus of FIG. 2. At 322 the temperature of a TMAH bath is measured and maintained at a predetermined temperature, in an embodiment 90° C. A measured small amount of ammonium hydroxide solution, in an embodiment 1% of the etch solution volume, is added to the hot TMAH at 324, a process that may be known as spiking. At least one substrate containing a poly layer to be etched, typically patterned photo-resist coated wafers, are immersed in the bath at 326, and left to etch for a predetermined time period. In an embodiment the etch rate of poly is about 4,000 Å/minute. At 328 the substrates are removed from the etch bath and rinsed in DI water, or other washing procedures, and then dried at 330. Spin drying or blow drying may typically be used. Alternatively, the imaged photo resist layer may be removed prior to drying the wafer, or even prior to washing the wafer. At 332 the substrate is moved to further substrate processing, such as photoresist removal, or dielectric deposition, or various memory or MEM fabrication steps.

Figure 4A:
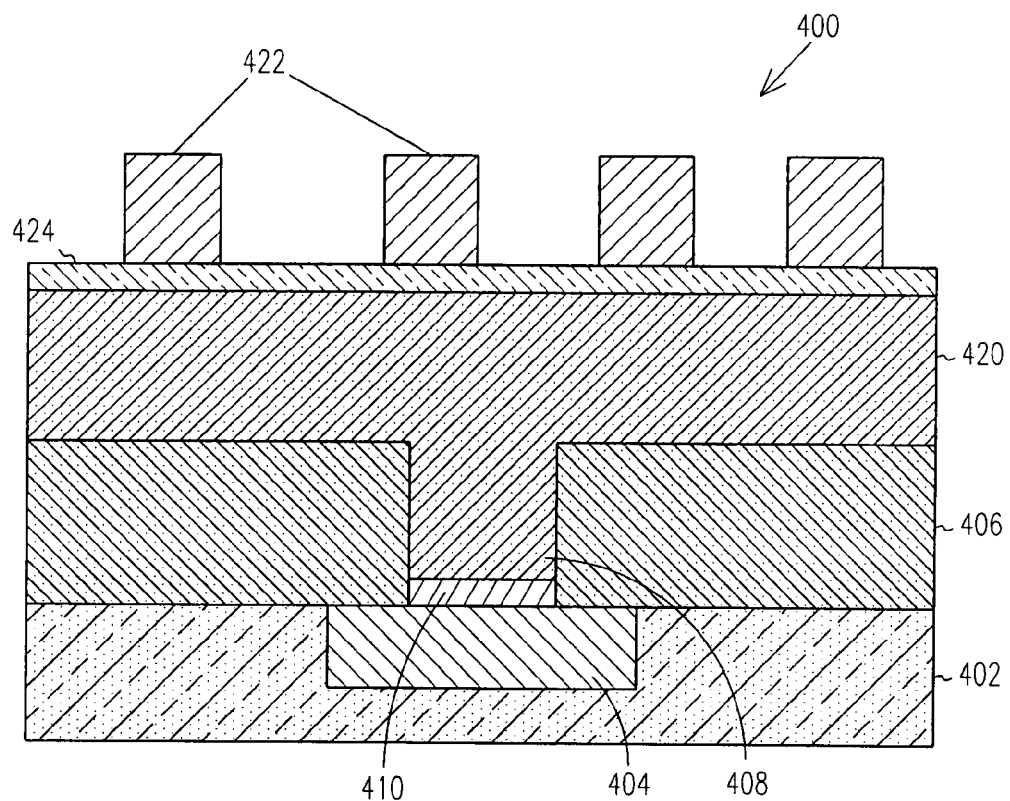
FIG. 4A shows an embodiment of a contact in a dielectric layer having a layer of polysilicon with a patterned photoresist layer.

FIG. 4A illustrates a semiconductor device 400 prior to decap and poly etch in accordance with the present invention. A substrate 402, illustratively a semiconductor wafer, has a diffused region 404, covered by a dielectric layer, such as silicon oxide layer 406. The dielectric layer 406 has a hole, or contact recess 408 formed through the dielectric 406 to contact the diffused region 404. A deposited layer of conductive TiN 410 covers the flat portion of the contact recess 408. A layer of polysilicon 420, which may be either doped or undoped, overlays the dielectric 406, and fills the contact recess 408.

The polysilicon layer 420 may have what may be known as a native oxide layer 424 that may form in varying thicknesses due to exposure of the polysilicon layer 420 to the oxygen or moisture in the air during the time period after the polysilicon deposition, during the patterning process, and before the poly etch process. Removing this native oxide, also known as an oxide cap, may be known as a decapping process. A patterned photoresist layer 422 is formed on those portions of the polysilicon layer 420 that are desired to remain after the poly etch process.

Figure 4B:
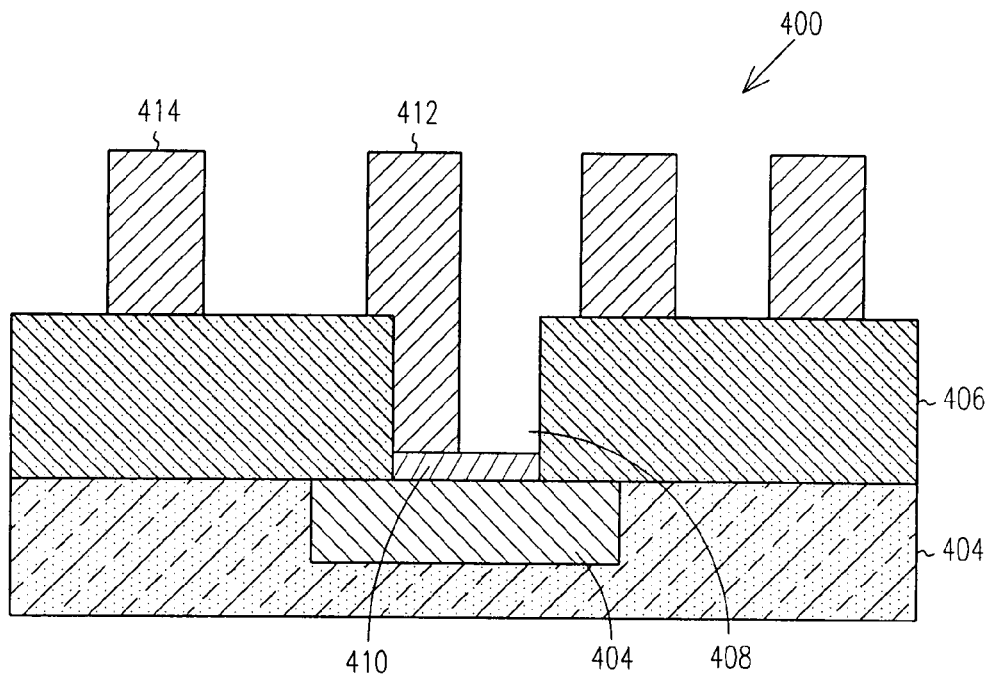
FIG. 4B shows the embodiment of FIG. 4A after etching in accordance with the invention, showing a contact in a dielectric layer having patterned polysilicon conductors.

FIG. 4B illustrates the semiconductor device 400 after decap and poly etch in accordance with the present invention. There are etched poly lines shown going into the plane of the figure, and the photoresist layer has been removed to better show the finished poly lines. There may be a remaining cap oxide layer on the tops of the etched poly lines 412 or 414, or the photoresist removal process may strip off the cap oxide along with the photoresist. Any possible remaining oxide cap is not shown in this figure, but whether or not the cap oxide still exists does not affect the device or the processing of the device.

A number of patterned and etched poly lines are shown with an orientation that is into and out of the plane of the figure. The poly lines such as 412 may be used to make an electrical contact to the diffused region 404 through the TiN layer 410, and may also make contact with an overlaying layer of metal, such as aluminum. The TiN layer may be used in the contact recess 408 to prevent aluminum to silicon alloy spikes, or to prevent impurity contamination from reaching the sensitive electrical region at the diffusion to substrate boundary. Since the poly line 412 may be unintentionally (or intentionally) not completely covering the bottom of the contact recess 408, it may be important to have a poly etch process that has a large poly to TiN etch ratio, so that the TiN may act as an etch stop. In a similar fashion, the poly lines 414 on the top of the dielectric layer 406 should have a etch process that has a large poly to oxide etch ratio, so as to not unnecessarily thin the protective dielectric layer 406.

Structures such as shown in FIG. 4 may be used in any integrated circuit or transistor devices, such as flash memory devices as well as other memory, logic or information handling devices and systems. Embodiments of these information handling devices include wireless systems, telecommunication systems, computers and integrated circuits.

Figure 5:
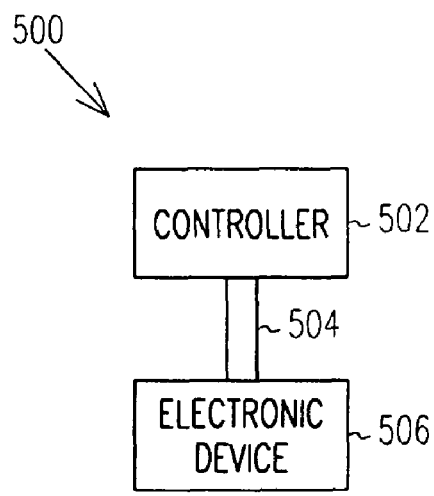
FIG. 5 is a simplified diagram for an embodiment of a controller coupled to an electronic device.

FIG. 5 illustrates a diagram for an electronic system 500 having one or more devices having etched poly layers formed according to various embodiments of the present invention. Electronic system 500 includes a controller 502, a bus 504, and an electronic device 506, where bus 504 provides electrical conductivity between controller 502 and electronic device 506. In various embodiments, controller 502 and/or electronic device 506 include an embodiment for a conductive TiN layer in the contact recesses, and etched polysilicon lines as previously discussed herein. Electronic system 500 may include, but is not limited to, information handling devices, wireless systems, telecommunication systems, fiber optic systems, electro-optic systems, and computers.

Figure 6:
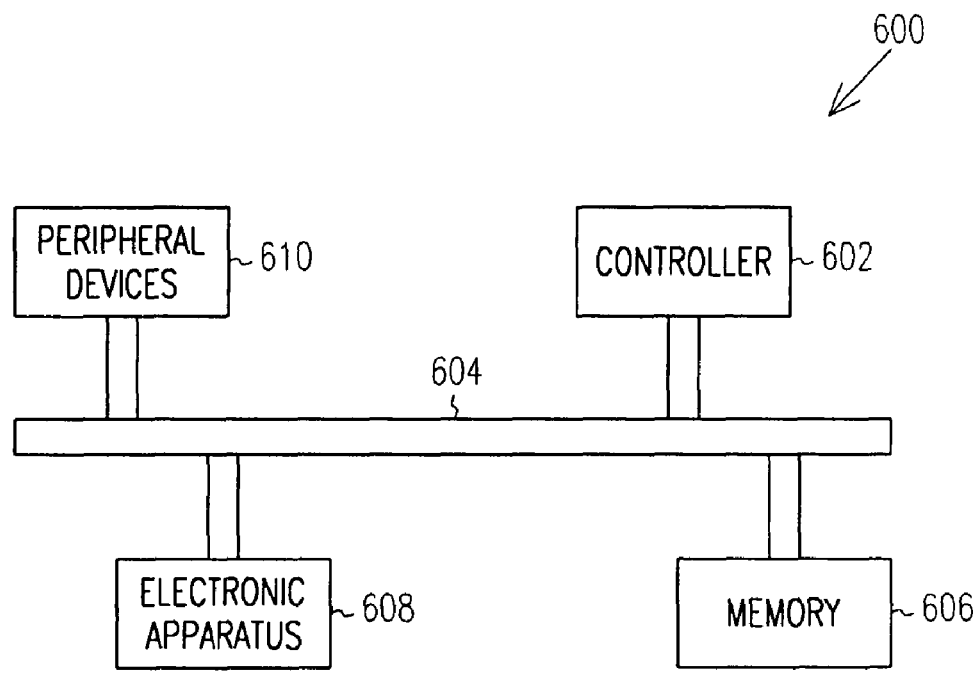
FIG. 6 illustrates a diagram for an embodiment of an electronic system having devices.

FIG. 6 depicts a diagram of an embodiment of a system 600 having a controller 602 and a memory 606. Controller 602 and/or memory 606 include an etched conductive poly layer as described herein. System 600 also includes an electronic apparatus 608, and a bus 604, where bus 604 may provide electrical conductivity and data transmission between controller 602 and electronic apparatus 608, and between controller 602 and memory 606. Bus 604 may include an address, a data bus, and a control bus, each independently configured. Bus 604 also uses common conductive lines for providing address, data, and/or control, the use of which may be regulated by controller 602. In an embodiment, electronic apparatus 608 includes additional memory devices configured similarly to memory 606. An embodiment includes an additional peripheral device or devices 610 coupled to bus 604. In an embodiment controller 602 is a processor. Any of controller 602, memory 606, bus 604, electronic apparatus 608, and peripheral device or devices 610 may include a signal conductor layer having an etched poly layer in accordance with the disclosed embodiments. System 600 may include, but is not limited to, information handling and telecommunication systems, and computers. Peripheral devices 610 may include displays, additional storage memory, or other control devices that may operate in conjunction with controller 602 and/or memory 606.

The use of an integrated decapping and polysilicon etch in a single etch bath has cost and time of manufacture benefits over etch systems that use separate etch baths for the decap etch versus the poly etch. Typically, a dilute hydrofluoric acid (HF) is used to remove the cap oxide, since HF solutions may be buffered to provide an etch rate that is consistent over a fairly long time period. After the HF decapping etch, the substrates must be washed and dried because of safety concerns with acids in general, and that acids and basic solutions such as TMAH have exothermic reactions when mixed. Thus, the poly etch process requires two different and typically incompatible etch baths that should not be located near each other due to safety concerns. This increases the cost and the amount of fabrication area needed for the etch process, and causes increased safety concern and chemical disposal problems. In addition, the time to etch the poly has increased, which also increases manufacturing cost.

The above-mentioned issues are addressed by the present invention and will be understood by reading and studying the specification. A method of etching a polysilicon layer consists essentially of adding a spike of an ammonium hydroxide solution to a bath of tetra methyl ammonium hydroxide (TMAH) solution, and then immersing the substrate with the polysilicon layer in the solution. In an embodiment, the substrate is immersed in the ammonium hydroxide and TMAH solution within one hour of when the ammonium hydroxide spike was added. The substrate is removed after the preselected etch time period, and the substrate is washed to remove the ammonium hydroxide and TMAH etching solution from the substrate, and the substrate is dried. The ammonium hydroxide and TMAH solution provides a rapid decap and polysilicon etch rate in a temperature range of approximately 60° C. to 90° C. It is possible to increase the etch rate by use of a pressure cooker type arrangement that allows the temperature of the TMAH to be raised to above the boiling point of the solution. The etch process may also be preformed on a spin vacuum chuck with either pressure spray dispense nozzles, carrier gas mist dispense nozzles, or with low pressure stream flow dispense nozzles. The TMAH concentration has a broad manufacturing tolerance and may vary between 2.5% and 25% in deionized (DI) water, but a preferred concentration is 12.5% to account for both dilution due to repeated spikes of ammonium hydroxide solution, and to account for evaporation during the course of the life of the etch bath. One method of controlling the life of the etch bath is to maintain the pH of the solution at a greater value than 13. The ammonium hydroxide solution used as the spike concentration is preferably approximately 35% in water, and the volume of the spike may vary from as low as 0.2% to as much as 2% of the total volume of the etch bath.

The decapping etch rate of the native silicon oxide layer on the top surface of the polysilicon layer may be greater than 800 Angstroms per minute. The etch rate of the polysilicon layer is approximately 4000 Angstroms per minute with the etch rate of the underlying oxide layer less than 20 Angstroms per minute.

These and other aspects, embodiments, advantages, and features will become apparent from the description and the referenced drawings.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention, including TiN layers with graded compositions. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiments of the above structures and fabrication methods are used. The scope of the embodiments of the present invention should be determined with reference to the appended claims, along with the full scope of equivalents to which such claims are entitled.

What is claimed is:

1. A method of fabricating an electronic memory, comprising:
    forming a substrate including an array of active electronic devices;
    forming at least one polysilicon layer on the substrate having a patterned photoresist layer on the at least one polysilicon layer; and
    patterning the polysilicon layer in a single step etch solution, comprising exposing the substrate having the patterned photoresist layer on the polysilicon layer for a predetermined time period to a liquid chemical etch solution containing at least tetra methyl ammonium hydroxide and water at a preselected temperature and first concentration, and at least a fixed percentage of an ammonium hydroxide solution, wherein the ammonium hydroxide solution is added to the tetra methyl ammonium hydroxide and water solution after the preselected temperature is obtained.

2. The method of claim 1, wherein the ammonium hydroxide solution is added to the tetra methyl ammonium hydroxide and water solution after the preselected temperature is obtained before the substrate is exposed to the solution.

3. The method of claim 2, wherein the tetra methyl ammonium hydroxide solution has a temperature of between 60° C. to 80° C., and the fixed percentage of ammonium hydroxide is greater than 1% of the volume of the tetra methyl ammonium hydroxide and water solution.

4. The method of claim 2, wherein the tetra methyl ammonium hydroxide solution has a concentration between 10% to 15% in deionized water, the ammonium hydroxide solution has a concentration between 25% to 40% in deionized water, and the pH of the solution is greater than 13.

5. A method of etching an oxide cap layer on a polysilicon layer, comprising:
    adding a first volume of an ammonium hydroxide solution to a second volume of a tetra methyl ammonium hydroxide solution at a first time period;
    immersing the polysilicon layer in the ammonium hydroxide and tetra methyl ammonium hydroxide solution within one hour of the first time period;
    removing the polysilicon layer from the ammonium hydroxide and tetra methyl ammonium hydroxide solution after a first preselected time period to etch both an oxide cap layer and at least a portion of the polysilicon layer;
    washing the polysilicon layer to remove essentially all of the ammonium hydroxide and tetra methyl ammonium hydroxide solution from the polysilicon layer; and
    drying the polysilicon layer.

6. The method of claim 5, wherein the first volume is less than 2% of the second volume.

7. The method of claim 5, wherein the polysilicon layer is removed from the ammonium hydroxide and tetra methyl ammonium hydroxide solution after a second preselected time period greater than the first preselected time period to etch the oxide cap layer and substantially the entire polysilicon layer.

8. The method of claim 5, wherein the tetra methyl ammonium hydroxide solution has a temperature of between 60° C. to 80° C., the tetra methyl ammonium hydroxide solution has a concentration between 10% to 15% in deionized water, the ammonium hydroxide solution has a concentration between 25% to 40% in deionized water, and the pH of the solution is greater than 13.

9. A method of fabricating an electronic memory, comprising:
    forming electronic devices on at least one surface of a substrate;
    forming a polysilicon layer on the substrate;
    forming a patterned photoresist layer on the polysilicon layer;
    etching completely through the polysilicon layer in regions exposed by the patterned photoresist layer in only a single step in a single etch solution;
    wherein the etching includes exposing the polysilicon layer and the patterned photoresist layer on the polysilicon layer for a predetermined time period to a liquid chemical etch solution including tetra methyl ammonium hydroxide in a volume concentration between 10% to 15% in water at a preselected temperature between 60° C. to 80° C. and first volume concentration; and
    including an ammonium hydroxide solution having a fixed volume percentage greater than 1% of the volume of the tetra methyl ammonium hydroxide and water solution.

10. The method of fabricating an electronic memory of claim 9, further comprising adding the ammonium hydroxide solution to the tetra methyl ammonium hydroxide and water solution before the substrate is exposed to the tetra methyl ammonium hydroxide and ammonium hydroxide solution.

11. The method of fabricating an electronic memory of claim 10, wherein the tetra methyl ammonium hydroxide solution has a temperature of 70° C., and the fixed percentage of ammonium hydroxide is about 2% of the volume of the tetra methyl ammonium hydroxide and water solution.

12. The method of fabricating an electronic memory of claim 10, wherein the tetra methyl ammonium hydroxide solution has a volume concentration of about 12.5% in deionized water, the ammonium hydroxide solution has a volume concentration between 25% to 40% in deionized water, and the pH of the single etch solution is greater than 13.

13. A method of etching an oxide cap layer on a polysilicon layer, comprising:
    forming a polysilicon layer on a substrate;
    forming a oxide cap layer on the polysilicon layer
    forming a patterned photoresist layer on the oxide cap layer;
    adding a first volume of an ammonium hydroxide solution having a volume concentration between 25% to 40% in water to a second volume of a tetra methyl ammonium hydroxide solution having a volume concentration between 10% to 15% in water at a first time period;
    immersing the substrate with the polysilicon layer in the ammonium hydroxide and tetra methyl ammonium hydroxide solution within a fixed time from the first time period;

removing the substrate with the polysilicon layer from the ammonium hydroxide and tetra methyl ammonium hydroxide solution after a first preselected time period to etch completely through portions of the oxide cap layer and of the polysilicon layer exposed by the patterned photoresist layer;

washing the substrate to remove essentially all of the ammonium hydroxide and tetra methyl ammonium hydroxide solution from the substrate; and drying the substrate.

14. The method of etching an oxide cap layer on a polysilicon layer of claim 13, wherein the first volume is less than 2% of the second volume, and the fixed time period is one hour.

15. The method of etching an oxide cap layer on a polysilicon layer of claim 13, wherein the tetra methyl ammonium hydroxide solution has a temperature of between 60° C. to 80° C., the tetra methyl ammonium hydroxide solution has a concentration of about 12.5% in deionized water, the ammonium hydroxide solution has a concentration of about 35% in deionized water, and the pH of the tetra methyl ammonium hydroxide and ammonium hydroxide solution is greater than 13.

16. A method of etching a patterned oxide layer on a polysilicon layer in a single chemical etch solution, comprising:

forming a polysilicon layer having an oxide layer on a substrate;

forming a patterned photoresist layer on the oxide layer;

exposing the patterned photoresist layer on the oxide layer to a liquid chemical etch solution containing at least tetra methyl ammonium hydroxide and water at a desired temperature and first volume concentration;

adding a fixed percentage of an ammonium hydroxide solution to the etch solution, the ammonium hydroxide solution having a second volume concentration prior to exposing the patterned photoresist layer; and removing the substrate from the etch solution.

17. The method of etching a patterned oxide layer of claim 16, wherein the substrate is removed from the etch solution after a specified time period.

18. The method of etching a patterned oxide layer of claim 16, wherein the desired temperature of the tetra methyl ammonium hydroxide is in a range of approximately 60° C. to 90° C.

19. The method of etching a patterned oxide layer of claim 18, wherein the desired temperature is approximately 70° C.

20. The method of etching a patterned oxide layer of claim 16, wherein exposing the patterned photoresist layer on the oxide layer to a liquid chemical etch solution comprises a single wafer spinning vacuum chuck with at least a tetra methyl ammonium hydroxide and ammonium hydroxide dispensing nozzle.

21. The method of etching a patterned oxide layer of claim 20, wherein the dispensing nozzle provides a spray of liquid droplets, each droplet having a temperature of about 70° C.

22. The method of etching a patterned oxide layer of claim 16, wherein exposing the patterned photoresist layer on the oxide layer to a liquid chemical etch solution comprises an open bath container having a temperature control device disposed to maintain the open bath in a temperature range of approximately 65° C. to 75° C.

23. The method of etching a patterned oxide layer of claim 17, wherein the tetra methyl ammonium hydroxide first volume concentration is between 2.5% and 25% in water, and wherein the ammonium hydroxide second concentration is between 25% and 45% in water.

24. The method of etching a patterned oxide layer of claim 23, wherein the tetra methyl ammonium hydroxide concentration is 12.5% and the pH of the solution is greater than 13.

25. The method of etching a patterned oxide layer of claim 23, wherein the ammonium hydroxide second concentration is approximately 35% in water, and the fixed percentage of ammonium hydroxide solution is greater than about 0.2%, and less than about 1% of the volume of the tetra methyl ammonium hydroxide solution.

26. The method of etching a patterned oxide layer of claim 25, wherein further:

an etch rate of the oxide layer on the polysilicon layer is greater than 800 Angstroms per minute;

an etch rate of the polysilicon layer is about 4000 Angstroms per minute; and an etch rate of a doped oxide layer underneath the polysilicon layer is less than 20 Angstroms per minute.

* * * * *